United States Patent
Stanford et al.

(10) Patent No.: US 6,496,015 B2
(45) Date of Patent: Dec. 17, 2002

(54) METHOD OF PERFORMING A DIELECTRIC VOLTAGE-WITHSTAND TEST ON A WIRE HARNESS

(75) Inventors: James G. Stanford, Ardmore, TN (US); Eric S. Karst, Fort Wayne, IN (US)

(73) Assignee: Pent Products, Inc., Kendallville, IN (US)

( * ) Notice: Subject to any disclaimer, the term of this patent is extended or adjusted under 35 U.S.C. 154(b) by 16 days.

(21) Appl. No.: 09/855,953

(22) Filed: May 15, 2001

(65) Prior Publication Data

US 2002/0171434 A1 Nov. 21, 2002

(51) Int. Cl.[7] ................... H01H 31/02; G01R 31/00; G01R 31/14
(52) U.S. Cl. .............. 324/541; 324/508; 324/509; 324/510; 324/511
(58) Field of Search ................ 324/511, 508, 324/541, 509, 510; 700/83, 17

(56) References Cited

U.S. PATENT DOCUMENTS

| | | | | |
|---|---|---|---|---|
| 5,050,093 A | * | 9/1971 | Reddy et al. ............. | 324/513 |
| 3,648,163 A | * | 3/1972 | Pinner et al. ............. | 324/510 |
| 4,228,475 A | * | 10/1980 | Sherwood ............... | 361/47 |
| 4,321,643 A | * | 3/1982 | Vernier ................. | 361/48 |
| 4,335,348 A | * | 6/1982 | Reed et al. .............. | 324/538 |
| 4,415,850 A | * | 11/1983 | Sherwood ............... | 324/509 |
| 6,215,313 B1 | * | 1/1998 | Lewandowski et al. ..... | 324/503 |
| 6,011,398 A | * | 4/1998 | Bald et al. .............. | 324/511 |
| 6,272,387 B1 | * | 11/1998 | Yoon ................... | 700/83 |

* cited by examiner

*Primary Examiner*—N. Le
*Assistant Examiner*—Wasseem H. Hamdan
(74) *Attorney, Agent, or Firm*—Taylor & Aust, P.C.

(57) ABSTRACT

A method of performing a dielectric voltage-withstand test on a wire harness having a plurality of conductors includes applying voltage simultaneously to a first subset of the conductors. The first subset includes at least two of the conductors. An electrical characteristic of each of the conductors excluded from the first subset of conductors is measured. The applying and measuring steps are repeated for at least one additional subset of the conductors. It is decided whether the wire harness passes the test based upon at least one of the measuring steps.

16 Claims, 2 Drawing Sheets

|  | Wire 1 | Wire 2 | Wire 3 | Wire 4 | Wire 5 | Wire 6 | Wire 7 | Wire 8 |
|---|---|---|---|---|---|---|---|---|
| 1st Test | ← | | | | | | | |
| 2nd Test | | ← | | | | | | |
| 3rd Test | | | ← | | | | | |
| 4th Test | | | | ← | | | | |
| 5th Test | | | | | ← | | | |
| 6th Test | | | | | | ← | | |
| 7th Test | | | | | | | ← | |

Fig. 1

|  | Wire 1 | Wire 2 | Wire 3 | Wire 4 | Wire 5 | Wire 6 | Wire 7 | Wire 8 |
|---|---|---|---|---|---|---|---|---|
| 1st Test | ← | | | | | | ← | |
| 2nd Test | | ← | ← | ← | ← | ← | | |
| 3rd Test | | | | | ← | ← | | |

Fig. 3

METHOD OF PERFORMING A DIELECTRIC VOLTAGE-WITHSTAND TEST ON A WIRE HARNESS

BACKGROUND OF THE INVENTION

1. Field of the invention

The present invention relates to performing manufacturing and production line tests on a wire harness, and, more particularly, to performing a dielectric voltage-withstand test on a wire harness.

2. Description of the Related Art

It is known to perform tests on wiring harnesses after their manufacture in order to ensure the continuity and integrity of the wiring harnesses. PLC harness testers perform two primary functions; namely, verifying the continuity of each of the wires, and verifying the integrity of the insulation surrounding the wires. In order to verify the integrity of the insulation and ensure that no short circuits exist between the wires of the wire harness, an insulation dielectric voltage-withstand test is performed. More particularly, the testers perform the manufacturing and production line tests outlined by the testing requirements specified by Underwriters Laboratory for office furnishings, i.e., UL 1286.

The Dielectric Voltage-Withstand Test outlined in UL 1286 calls for a 40–70 Hz potential of 1200V to be applied to each wire of the wire harness for a duration of one second to determine whether an insulation breakdown has occurred. In essence, this test verifies the insulation integrity of all current-carrying conductors with respect to all other conductors including ground.

For the dielectric voltage-withstand test, the ground conductor does not have the dielectric voltage applied directly to it. This is because the ground conductor is connected to bare metal of the completed harness. With this, the total test time in terms of dielectric voltage-withstand is one second per conductor. Accounting for high-voltage control relay transitions, a typical eight-wire harness takes just under eight seconds to undergo the dielectric test.

What is verified during the eight-second dielectric test is that no conductor leaks any current to any other conductor or to bare metal of the harness assembly. The test sequence is as shown in FIG. 1. In the first test, voltage is applied only to wire 1. After this first test, voltage is then individually applied to each of wires 2–7 in sequence, as indicated by the second through seventh tests.

With this topology, the ground conductor connected to the bare metal is connected as wire number eight and will therefore never have the dielectric high-voltage applied to it directly as the live conductor of the high voltage potential. If any conductor hipots, i.e., short-circuits, to either bare metal or any other conductor, the hipot indicates a dielectric breakdown failure due to exceeding the current limit set by the dielectric high-voltage source.

Since voltage is applied to each of the seven conductors individually for at least one second, the total test time for a wire harness is in excess of seven seconds. This limits how quickly the wire harnesses can be tested.

What is needed in the art is a method of performing a dielectric voltage-withstand test on a wire harnesses that takes less time than known methods.

SUMMARY OF THE INVENTION

The present invention provides a method of shortening the time of a dielectric voltage-withstand test by testing multiple conductors simultaneously.

The method of the present invention reduces the number of discrete tests within the dielectric test regime from seven to three. This reduces the period of one dielectric test cycle from just below eight seconds to just over three seconds. This reduction is achieved by simultaneously applying the dielectric high-voltage to more than one conductor.

The invention comprises, in one form thereof, a method of performing a dielectric voltage-withstand test on a wire harness having a plurality of conductors. Voltage is simultaneously applied to a first subset of the conductors. The first subset includes at least two of the conductors. An electrical characteristic of each of the conductors excluded from the first subset of conductors is measured. The applying and measuring steps are repeated for at least one additional subset of the conductors. It is decided whether the wire harness passes the test based upon at least one of the measuring steps.

An advantage of the present invention is that less time is required to perform a dielectric voltage-withstand test on a wire harness.

Another advantage is that the method of the present invention is more sensitive to the actual monitored leakage current between the conductors of the wire harness.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein:

FIG. 1 is a table specifying a known dielectric voltage-withstand testing sequence;

FIG. 3 is a table specifying a dielectric voltage-withstand testing sequence that can be used in the method of the present invention.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

Figure 2:
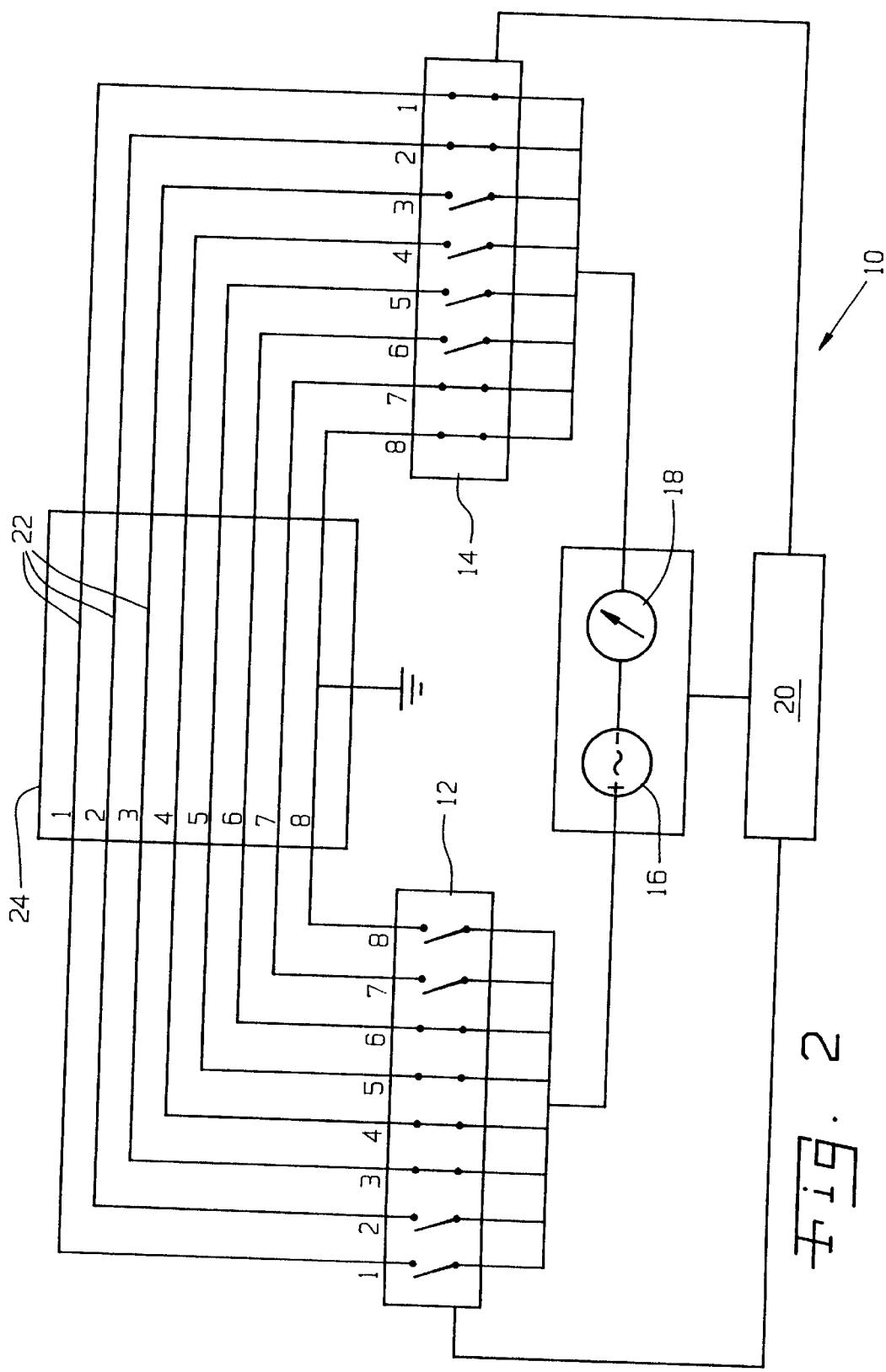
FIG. 2 is a schematic diagram of a testing apparatus that can be used in conjunction with one embodiment of the dielectric voltage-withstand testing method of the present invention.

One embodiment of a testing apparatus 10 (FIG. 2) of the present invention includes an input relay switch module 12, an output relay switch module 14, voltage source 16, current meter 18 and programmable logic controller (PLC) 20, which may be a microprocessor. Each of the eight conductors 22 of a wire harness 24 are electrically connected to the eight switches of each of input relay switch module 12 and output relay switch module 14.

In a first test of a test sequence of the method of the present invention (FIG. 3), voltage is simultaneously applied to each of wires 3–6 of harness 24. This is achieved by using PLC 20 to close switches 3–6 of input relay switch module 12. At the same time, PLC 20 closes switches 1–2 and 7–8 of output relay switch module 14. Thus, any electrical current that leaks from any of wires 3–6 of harness 24 to any of wires 1–2 and 7–8 is measured by current meter 18. If the current read by current meter 18 exceeds a threshold current. PLC 20 determines that wire harness 24 has failed the test due to a short circuit between one of wires 3–6 and one of wires 1, 2, 7 or 8.

In a second test of the sequence, switches 1–2 and 5–6 are closed and switches 3–4 and 7–8 are open on input relay switch module 12. The switch positions of output relay switch module 14 are opposite to those of input relay switch module 12, as they are in each of the three tests. That is, in the second test, switches 1–2 and 5–6 are open and switches 3–4 and 7–8 are closed on output relay switch module 14. This allows PLC 20 to be isolated from the dielectric test voltage while PLC 20 monitors the conductors 22.

In a third test of the sequence, switches 2, 4 and 6–7 are closed and switches 1, 3, 5 and 8 are open on input relay switch module 12. Conversely, switches 2, 4 and 6-7 are open and switches 1, 3, 5 and 8 are closed on output relay switch module 14.

The above-described test sequence ensures that each conductor of wire harness 24 is dielectrically tested relative to each other conductor. As an example, if wire harness 24 has an isolation defect between wires one and two, the defect is not detected during the first test since both wires remain at zero potential. Wire harness 24 will pass the first test and will proceed to the second test.

During the second test, as in the first test, both wires one and two are at the same potential, i.e., the live side of the high-voltage potential. Since no defect occurs between any live conductor to the remaining conductors at zero potential, wire harness 24 will pass the second test as well and will proceed to the third test.

Wire harness 24 will fail the third test of the sequence because wire one is at zero potential whereas wire two is at the live high-voltage potential, thereby providing a current path between the two conductors. Current flows from wire two to wire one, through the closed switch 1 on output relay switch module 14, and is then measured by current meter 18.

By examining all possible wire pair isolation defect scenarios, it can be demonstrated that all combinations of dielectric failures are detected with the method of the present invention. In much the same manner, any dielectric failure between any single conductor to bare metal will be detected in a similar fashion due to the bare metal being continuously monitored for continuity to the ground conductor in position with wire eight.

There is no "true" closed circuit in the method of the present invention. That is, there is no "direct" path from the high side of voltage source 16, through wire harness 24, and back to the low side of voltage source 16. It is the "insulative losses" that provide the current path through wire harness 24, thereby resulting in a monitored current on current meter 18. This loss defines a dielectric withstand failure if the loss exceeds a predetermined limit.

In the present invention, four conductors 22 have the high-voltage potential simultaneously applied to them during each test. The known dielectric voltage-withstand test, which applies voltage to only one conductor 22 at a time, has a small current leakage, typically on the order of 0.1 to 0.3 milliamperes for the harness tester application. The present invention, by utilizing parallel currents, has increased sensitivity to the leakage current relative to any single conductor 22.

A small "loss" will be monitored on all conductors 22, even if there is no fault in wire harness 24. In the present invention, this "lost" current in one conductor 22 is in parallel with currents from three other conductors 22, and the sum of the four currents is what is displayed on current meter 18. Therefore, if the small loss of one conductor 22 does not exceed the predetermined limit, the combination of the small losses from four conductors 22 results in an increase in the total detected leakage current, thereby drawing closer to the predetermined limit.

In another embodiment, a sixteen-wire harness can be checked by a sequence of four tests, each of which applies voltage to eight of the conductors. In general, the total number of test sequences required is less than or equal to m, wherein m satisfies the equation:

$$2^{m-1} < C \leq 2^m,$$

and wherein C is the total number of conductors in the harness.

The present invention has been described herein as measuring electrical currents on the output side of wire harness 24. However, it is to be understood that the present invention may be performed by measuring another electrical characteristic on the output side of wire harness 24, such as voltage. Moreover, the output electrical characteristic need not be measured while the input voltage is being applied. For example. the output voltages may be used to charge capacitors to voltage levels that are measured after the input voltage has ceased.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A method of performing a dielectric voltage-withstand test on a wire harness having a plurality of conductors, said method comprising the steps of:

applying voltage simultaneously to a first subset of the conductors, said first subset including at least two of the conductors;

measuring an electrical characteristic of each of the conductors excluded from said first subset of conductors;

repeating said applying and measuring steps for at least one additional subset of the conductors;

wherein a total number of said subsets is less than a total number of the conductors; and wherein the total number of said subsets is one of less than and equal to m, wherein m satisfies the equation:

$$2^{m-1} < C < 2^m,$$

and wherein C is the total number of the conductors; and deciding whether the wire harness passes the test, said deciding being based upon at least one of said measuring steps.

2. The method of claim 1, wherein each said measuring step occurs during a corresponding said applying step.

3. The method of claim 1, wherein the electrical characteristic comprises a level of electrical current flowing through each of the conductors excluded from said first subset of conductors.

4. The method of claim 1, wherein the electrical characteristic comprises a total of respective electrical currents flowing through each of the conductors excluded from said first subset of conductors.

5. The method of claim 4, wherein said deciding step is based on whether said total of said respective electrical currents exceeds a predetermined threshold level of current.

6. The method of claim 1, wherein said deciding step is based exclusively upon said measuring steps.

7. The method of claim 1, wherein at least one of said conductors is included in at least two of said subsets.

8. The method of claim 1, wherein one of the conductors is included in all of said subsets.

9. The method of claim 1, wherein one of the conductors is included in none of said subsets.

10. The method of claim 9, wherein said one conductor is connected to electrical ground.

11. A method of performing a dielectric voltage-withstand test on a wire harness having eight conductors, said method comprising the steps of:

applying voltage simultaneously to a first set of four of the conductors;

measuring an electrical characteristic of each of the conductors excluded from said first set of conductors;

applying voltage simultaneously to a second set of four of the conductors, two of the second set of conductors also being in said first set of conductors;

measuring an electrical characteristic of each of the conductors excluded from said second set of conductors;

applying voltage simultaneously to a third set of four of the conductors, a first conductor of the third set of conductors also being in said first set of conductors, a second conductor of the third set of conductors also being in said second set of conductors, a third conductor of the third set of conductors also being in each of said first set of conductors and said second set of conductors, and a fourth conductor of the third set of conductors being in neither said first set of conductors nor said second set of conductors;

measuring an electrical characteristic of each of the conductors excluded from said third set of conductors; and deciding whether the wire harness passes the test, said deciding being based upon at least one of said measuring steps.

12. The method of claim 11, wherein each said measuring step occurs during a corresponding said applying step.

13. The method of claim 11, wherein the electrical characteristic comprises a level of electrical current flowing through each of said excluded conductors.

14. The method of claim 11, wherein the electrical characteristic comprises a total of respective electrical currents flowing through each of said excluded conductors.

15. The method of claim 14, wherein said deciding step is based on whether said total of said respective electrical currents exceeds a predetermined threshold level of current.

16. The method of claim 11, wherein said deciding step is based exclusively upon said measuring steps.

* * * * *